United States Patent [19]
Endo et al.

[11] Patent Number: 6,064,246
[45] Date of Patent: *May 16, 2000

[54] LOGIC CIRCUIT EMPLOYING FLIP-FLOP CIRCUIT

[75] Inventors: Yukio Endo, Tokyo; Masato Nagamatsu, Kanagawa-ken, both of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/949,558

[22] Filed: Oct. 14, 1997

[30] Foreign Application Priority Data

Oct. 15, 1996 [JP] Japan ................................. 8-272516

[51] Int. Cl.[7] ................................................. H03K 3/289
[52] U.S. Cl. ........................... 327/202; 327/211; 327/218
[58] Field of Search ................................. 327/215, 219, 327/225, 202, 203, 199, 200, 201, 208–212, 218

[56] References Cited

U.S. PATENT DOCUMENTS

| | | | |
|---|---|---|---|
| 5,321,399 | 6/1994 | Notani et al. ............................ | 341/100 |
| 5,406,134 | 4/1995 | Menut ..................................... | 327/203 |
| 5,497,114 | 3/1996 | Shimozono ............................. | 327/202 |
| 5,498,988 | 3/1996 | Reyes et al. ............................ | 327/199 |
| 5,517,145 | 5/1996 | Frank ...................................... | 327/201 |
| 5,546,035 | 8/1996 | Okamoto ................................ | 327/208 |
| 5,557,225 | 9/1996 | Denham et al. ........................ | 327/199 |
| 5,668,490 | 9/1997 | Mitra et al. ............................. | 327/203 |

*Primary Examiner*—Tuan T. Lam
*Attorney, Agent, or Firm*—Foley & Lardner

[57] ABSTRACT

A flip-flop circuit consists of a conventional pulse-drive flip-flop plus a clock driver and a local pulse generator that generates a pulse signal according to the output of the clock driver. The flip-flop circuits of this kind are used to form, for example, a shift register in which the clock drivers are connected in series from the last stage toward the first stage. The clock driver in the last stage receives a clock signal, which is successively supplied to the flip-flop circuits from the one in the last stage toward the one in the first stage. This arrangement prevents a data-pass-through problem, assures a sharp waveform of pulse signals, and reduces the size of each clock driver. This type of flip-flop circuits may be used to form logic circuits such as N-bit registers and N-bit shift registers.

20 Claims, 13 Drawing Sheets

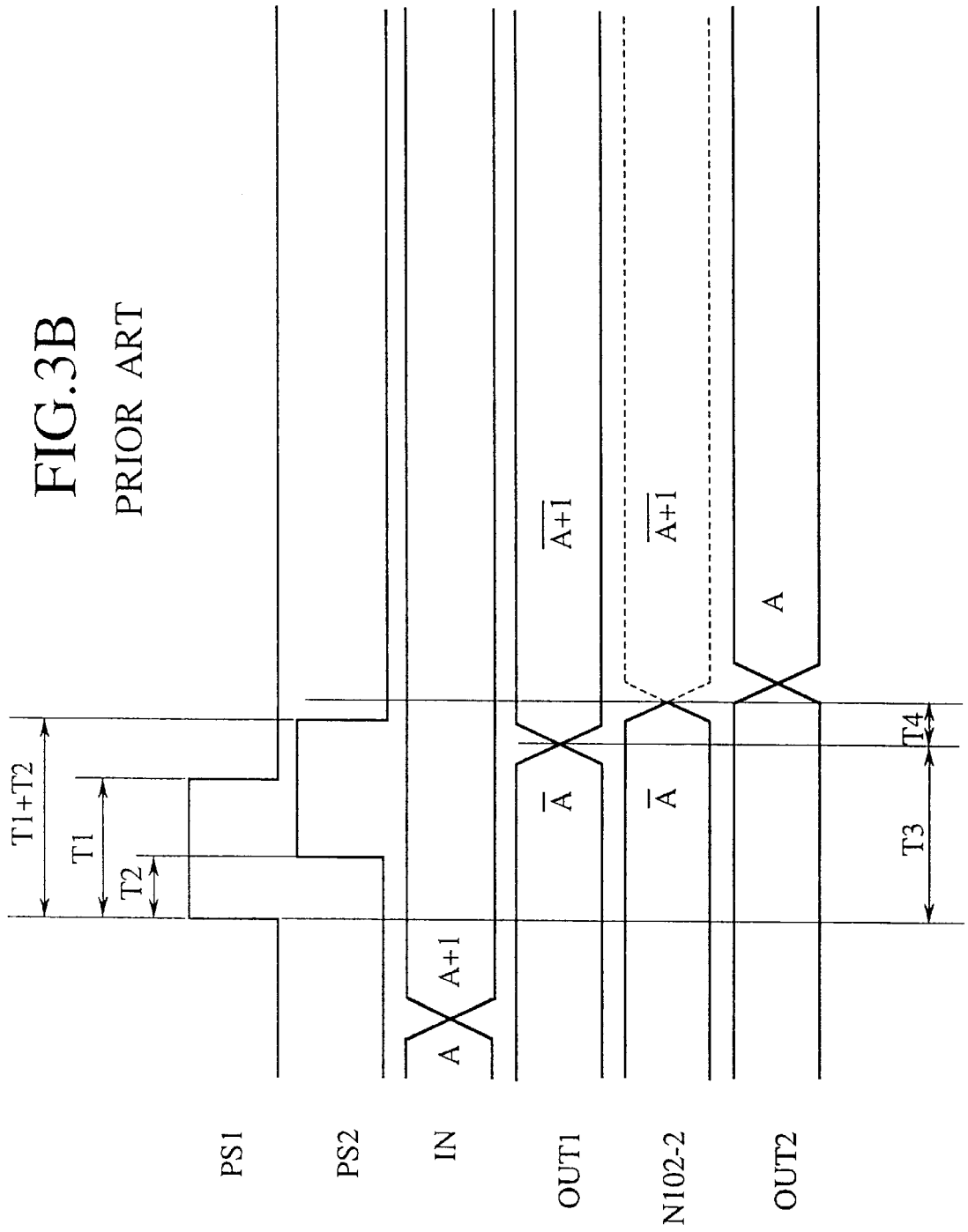

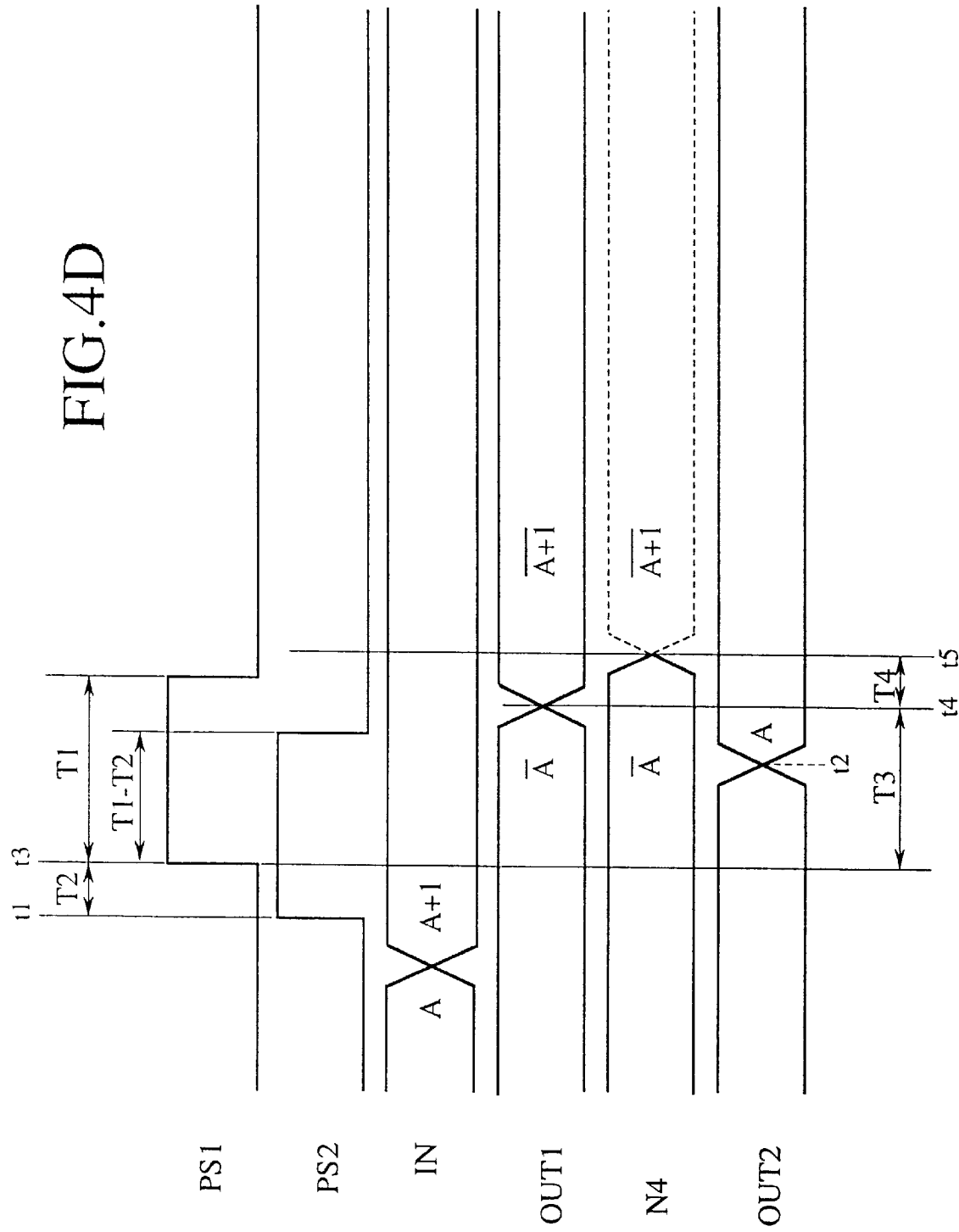

LOGIC CIRCUIT EMPLOYING FLIP-FLOP CIRCUIT

BACKGROUND OF THE INVENTION

1. Field of the Invention

The present invention relates to a flip-flop circuit, a shift register, an N-bit register, and a logic circuit that are used in a semiconductor integrated circuit.

2. Description of the Prior Art

Among various types of flip-flop circuits, pulse drived flip-flop circuits (PD-FFs) are advantageous in reducing power consumption and simplifying circuit structure.

FIG. 1 shows a PD-FF according to a prior art. An input node N101 receives input data In and is connected to a transfer gate 103, which is connected to an intermediate node N102. The transfer gate 103 is turned on and off in response to an external pulse signal PS and an inverted pulse signal $\overline{PS}$ each having a given pulse width. Between the intermediate node N102 and an output node N104, a latch circuit 107 is arranged. The latch circuit 107 consists of an output inverter 105 and a feedback inverter 106 that are connected to each other in an antiparallel manner. An output terminal of the latch circuit 107 is equal to the output node N104, which provides output data Out.

When the pulse signal PS indicates 1, the PD-FF transfers the input data In to the intermediate node N102, and when the pulse signal PS indicates 0, holds the input data. By properly adjusting the pulse width of the pulse signal PS, it is possible to reduce power consumption.

FIG. 2 is a circuit diagram showing a logic circuit employing PD-FFs each being the same as the PD-FF of FIG. 1. The PD-FFs 201-1-1 to 201-N-1 are connected in parallel to form an N-bit register, and M stages of such N-bit registers (201-1-1 to 201-N-1, to 201-1-M to 201-N-M) are connected in series to form the logic circuit. A pulse generator (PG) 202 generates a pulse signal PS having a required pulse width according to a clock signal CLK and supplies simultaneously the pulse signal PS directly to all PD-FFs of the first N-bit register and further, through pulse drivers 203-1 to 203-(M−1) to the PD-FFs of the second to Mth N-bit registers.

FIG. 3A is a circuit diagram showing a part A of FIG. 2. The part A includes the PD-FFs 201-1-1 and 201-1-2 connected in series. The PD-FF 201-1-1 consists of a transfer gate 103-1 and a latch circuit 107-1, and the PD-FF 201-1-2 consists of a transfer gate 103-2 and a latch circuit 107-2. The PD-FF 201-1-1 receives a pulse signal PS1 and an inverted pulse signal $\overline{PS1}$ and provides output data Out1. The PD-FF 201-1-2 receives a pulse signal PS2 and an inverted pulse signal $\overline{PS2}$ and provides output data Out2.

The operation of the part A will be explained with reference to timing charts of FIGS. 3B and 3C. In FIGS. 3B and 3C, T1 is a pulse width of each of the pulse signals PS1 and PS2, T2 is a delay time between the pulse signals PS1 and PS2, and T3 is an output definition period starting when the pulse signal PS1 (PS2) is applied to the gate terminal of the transfer gate 103-1 (103-2) and ending when the output data Out1 (Out2) is provided. T4 is a delay time required for the potential at intermediate node N102-1 (N102-2) to reach a threshold potential of an output inverter in the latch circuit 107-1 (107-2) after an input data In (an output data Out1) arrived at an input node N101 (an output node N104-1) while the transfer gate 103-1 (1032) is in a conduction state.

When the pulse signal PS1 rises to "1", the input data In at the input node N101 is fetched by the PD-FF 201-1-1.

After the period T3, the data In arrives at the output node N104-"1", which provides output data Out1 as shown in FIG. 3B. After a predetermined period, if the transfer gate 103-2 of the PD-FF 201-1-2 is turned on, the output data Out1 is fetched by PD-FF 201-1-2, and arrives at an output node N104-2 after the period T3+T4 and is provided as output data Out2. The sum of the pulse width T1 and delay time T2 is a period starting when the transfer gate 103-1 is turned on and ending when the transfer gate 103-2 is turned off. This logic circuit of the prior art is effective to reduce the number of elements of each flip-flop circuit, lighten load on clock nodes, and lower power consumption. The logic circuit, however, has the following problems:

(a) The logic circuit may operate properly if T1+T2<T3+T4. If not so, data will pass from the input node N101 to the output node N104-2. More precisely, if T1+T2<T3+T4 as shown in n FIG. 3B, data A+1 is fetched by PD-FF 201-1-1 when the pulse signal PS1 rises to "1" and the data $\overline{A+1}$ is provided as Out1 after the period T3. The pulse signal PS2 falls to "0" before the output data Out1, or $\overline{A+1}$ is transferred to the intermediate node N102-2. Hence, "a data-pass-through problem" is not caused. And data A fetched previously by PD-FF 201-1-2 is provided as the output data Out2 after the period T3.

However, if T1+T2>T3+T4 as shown in FIG. 3C, the data A+1 fetched by PD-FF 201-1-1 with the pulse signal PS1 of "1" arrives as data $\overline{A+1}$ to the intermediate node N102-2 before the pulse signal PS2 falls to "0". And the data $\overline{A+1}$ is further fetched by PD-FF 201-1-2 and provided as the output data Out2, to cause the data-pass-through problem.

(b) The PD-FFs connected in parallel input-output configuration as shown in FIG. 2 increase gate load to make pulse signals loose sharpness. This may cause a data fetch error.

(c) To keep the pulse width T1 narrow, it is necessary to employ pulse drivers that operate at high speed. In FIG. 2, each of the pulse drivers 203-1 to 203-M must drive a pulse signal for all N bits. In this case, the driving capability of each pulse driver must be increased in proportion to the number (N) of bits.

SUMMARY OF THE INVENTION

An object of the present invention is to provide a flip-flop circuit applicable to a shift register or an N-bit register that is free from the data-pass-through problem.

Another object of the present invention is to provide a shift register that is free from the data-pass-through problem.

Still another object of the present invention is to provide an N-bit register capable of properly without requiring the large driving capability for the flip-flop circuits arranged in the register and to guarantee sharp pulse signals for driving the circuits.

Still another object of the present invention is to provide a logic circuit capable of preventing the data-pass-through problem while maintaining sharp pulse signals to drive the logic circuit.

Still another object of the present invention is to provide a shift register that is compact in size and free from the data-pass-through problem.

Still another object of the present invention is to provide a logic circuit that is compact, is free from the data-pass-through problem, and to assure sharp pulse signals for driving the circuits.

In order to accomplish the objects, a first aspect of the present invention provides a flip-flop circuit that has at least a transfer gate for passing or blocking input data in response to a pulse signal having a given pulse width, a latch circuit connected to an output terminal of the transfer gate, a clock driver for driving a clock signal, and a local pulse generator for generating the pulse signal according to the output of the clock driver.

A combination of the transfer gate and latch circuit in the flip-flop circuit of the first aspect corresponds to the conventional PD-FF. Then, the first aspect may be characterized by the local clock driver and local pulse generator added to the conventional PD-FF. When applied to a shift register, the flip-flop circuit of the first aspect prevents the data-pass-through problem as will be explained below. When applied to an N-bit register, the flip-flop circuit of the first aspect can maintain a sharp pulse signal because the first aspect causes no increase in gate load. In addition, the first aspect properly suppresses the increase of the driving capability of each flip-flop circuit in the N-bit register.

A second aspect of the present invention provides a shift register made of flip-flop circuits connected in series. Each of the flip-flop circuits consists of a transfer gate for passing or blocking input data in response to a pulse signal having a given pulse width, a latch circuit connected to an output terminal of the transfer gate, a clock driver for driving a clock signal, and a local pulse generator for generating the pulse signal according to the output of the clock driver. The clock drivers are connected in series from the last stage toward the first stage so that the clock signal is transferred successively from the last flip-flop circuit toward the first flip-flop circuit, accumulating predetermined delay time (delay period) at each stage so as to open the respective transfer gates at different timings.

The second aspect shortens a period that starts when a flip-flop circuit fetches input data in response to an activated pulse signal and ends when the transfer gate of the next flip-flop circuit is closed, thereby preventing the data pass-through problem between the adjacent flip-flop circuits.

A third aspect of the present invention provides an N-bit register made of N flip-flop circuits connected in parallel, where N represents a positive integer. Each of the flip-flop circuits consists of a transfer gate for passing and blocking input data in response to a pulse signal having a given pulse width, a latch circuit connected to an output terminal of the transfer gate, a clock driver for driving a clock signal, and a local pulse generator for generating the pulse signal according to the output of the clock driver. The clock drivers simultaneously receive a common clock signal.

The third aspect directly provides the transfer gates each with a local pulse signal. Accordingly, unlike the conventional N-bit register that involves heavy gate load when applying simultaneously a pulse signal to all PD-FFs with parallel input-outputs, the third aspect is capable of maintaining sharp pulse signals because the gate load does not increase. In addition, the third aspect distributes load on the clock drivers when driving many flip-flop circuits, thereby properly suppressing the requirement of large driving capability of the clock drivers. This results in making the size of each clock driver compact.

A fourth aspect of the present invention connects M stages of N-bit registers in series. Each of the N-bit registers is made of N flip-flop circuits with parallel input-outputs, and each of the flip-flop circuits consists of a transfer gate for passing and blocking input data in response to a pulse signal having a given pulse width, a latch circuit connected to an output terminal of the transfer gate, a clock driver for driving a clock signal, and a local pulse generator for generating the pulse signal according to the output of the clock driver. For each bit, the clock drivers are connected in series from the last stage (the Mth stage) toward the first stage. The clock drivers of the Mth N-bit register receive simultaneously a common clock signal, so that the clock signal is successively transmitted from the Mth N-bit register to the first N-bit register.

The fourth aspect may be considered as N shift registers connected in parallel. Similar to the second and third aspects, the fourth aspect assures the sharp pulse signals and surely prevents the data-pass-through problem. In addition, the fourth aspect properly suppresses the increase of driving capability of the clock drivers, to make the size of each clock driver compact, thereby reducing a circuit scale or a chip occupying area.

A fifth aspect of the present invention provides a shift register consisting of a first-type flip-flop circuit and "M−1" pieces of second-type flip-flop circuits. The first-type flip-flop circuit is the flip-flop circuit of the first aspect of the present invention. Each of the second-type flip-flop circuits is made of a transfer gate for passing and blocking input data in response to a pulse signal having a given pulse width, a latch circuit connected to an output terminal of the transfer gate, and a pulse driver for driving the pulse signal. The "M−1" pieces of the second-type flip-flop circuits are connected in series. The first-type flip-flop circuit is connected to the second-type flip-flop circuits in the Mth stage. The pulse drivers are connected in series from the "M−1"th stage toward the first stage, and a pulse signal generated by the local pulse generator of the first-type flip-flop circuit in the Mth stage is transmitted to the pulse driver in the "M−1"th stage which is successively transmitted to toward that in the first stage. Here, M is a positive integer.

The fifth aspect surely prevents the data-pass-through problem, like the second embodiment. In addition, the fifth aspect needs a smaller real estate because it arranges the local pulse generator only in the last stage.

A sixth aspect of the present invention provides a logic circuit, in particular, an N-bit shift register. The N-bit shift register is made of N lines of shift registers with parallel input-output each consisting of a sequence of "M−1" pieces of second-type flip-flop circuits connected in series and a first-type flip-flop circuit connected to the sequence of the second-type flip-flop circuits. The first-type flip-flop circuit is the flip-flop circuit explained in the first aspect of the present invention and is connected to the second-type flip-flop circuits in the Mth stage. Each of the second-type flip-flop circuits is made of a transfer gate for passing and blocking input data in response to a pulse signal having a given pulse width, a latch circuit connected to an output terminal of the transfer gate, and a pulse driver for driving a pulse signal. In each line, the pulse drivers are connected in series from the "M−1"th stage toward the first stage, and a pulse signal generated by the local pulse generator of the first-type flip-flop circuit is successively transmitted to the pulse drivers from the "M−1"th stage toward the first stage. In other words, the logic circuit of the sixth aspect may be considered as a circuit formed by arranging N lines of the shift registers mentioned in the fifth aspect in parallel. Here, M and N are positive integers.

The sixth aspect prevents the data-pass-through problem, guarantees the sharp waveform of pulse signals during the operation, and properly suppresses the demand for large driving capabilities of the clock drivers, like the fourth aspect. In addition, the sixth aspect is capable of reducing a circuit scale because it arranges the local pulse drivers only in the last stage.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 3B is a timing chart showing the operation of the part A;

FIG. 4D is a timing chart showing the operation of the shift register of FIG. 4A;

DETAILED DESCRIPTION OF THE EMBODIMENTS

Figure 1:
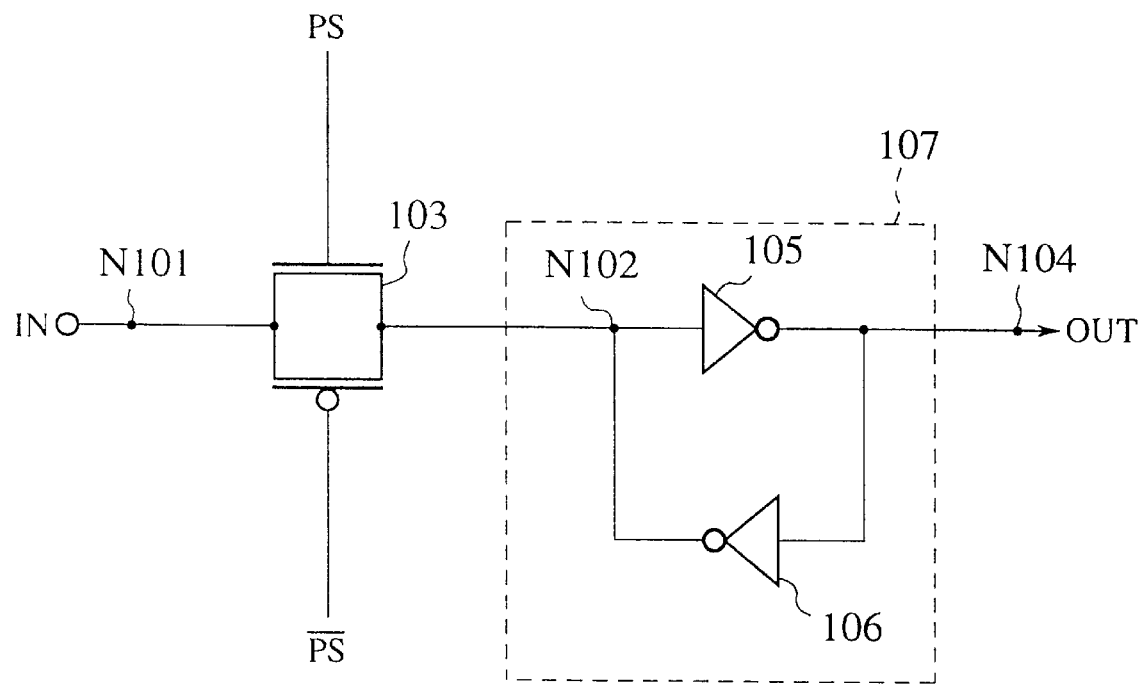
FIG. 1 is a circuit diagram showing a pulse drived flip-flop (PD-FF) according to a prior art.
Figure 2:
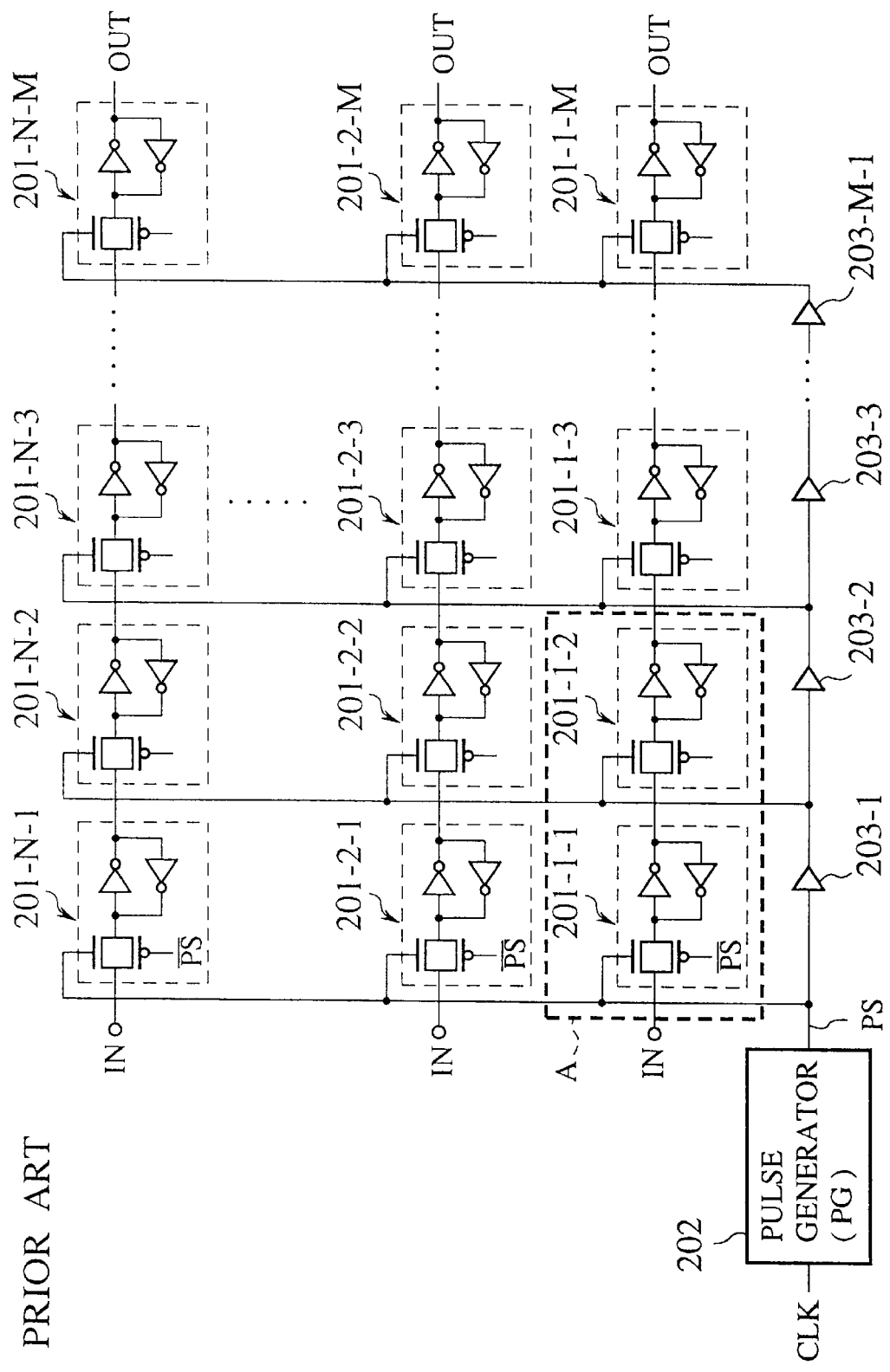
FIG. 2 is a circuit diagram showing a logic circuit employing the PD-FFs of the prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 4A:
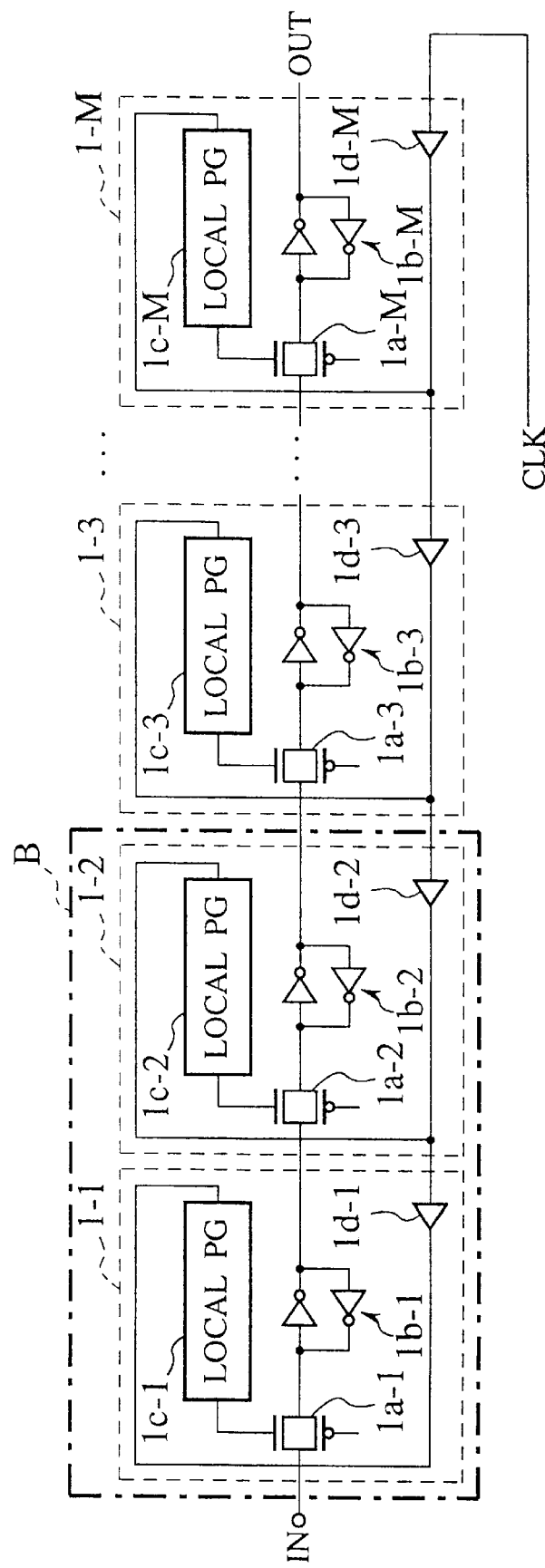
FIG. 4A shows a shift register according to a first embodiment of the present invention.

FIG. 4A shows a shift register according to the first embodiment of the present invention. The shift register consists of M stages of flip-flop circuits each connected to its left or right neighbor, the flip-flop circuit being the flip-flop circuit stated in the first aspect of the present invention (hereinafter called "the flip-flop circuit of the present invention"). For example, a flip-flop circuit 1-1 in the first stage has a CMOS transfer gate 1a-1 for passing and blocking input data In in response to a pulse signal PS1 applied to one of gate terminals and an inverted pulse signal $\overline{PS1}$ applied to another gate terminal, a latch circuit 1b-1 connected to an output terminal of the transfer gate 1a-1, a local pulse generator (PG) 1c-1, and a clock driver 1d-1. The latch circuit 1b-1 consists of two inverters connected to each other in antiparallel manner. One of the inverters, or the feedback inverters whose input terminal is connected to an output node N3 may be a clocked inverter which operates only at the pulse signal PS1 is "0". The local PG 1c-1 generates the pulse signal PS1 according to a clock signal CLK. The clock driver 1d-1 drives the clock signal CLK and supplies the same to the local PG 1c-1.

Each of the flip-flop circuits 1-2 to 1-M has the same structure as the first flip-flop circuit 1-1. Namely, the flip-flop circuits 1-2 to 1-M have CMOS transfer gates 1a-2 to 1a-M, latch circuits 1b-2 to 1b-M, local PGs 1c-2 to 1cM, and clock drivers 1d-2 to 1d-M. Each latch circuit 1b-2, 1b-3 ... 1b-M consists of two inverters connected in antiparallel manner (one of the inverters (feedback inverters) in each latch circuit may be the clocked inverter). Pulse signals generated by the local PGs 1c-1 to 1c-M have an identical pulse width.

The flip-flop circuits of the first embodiment are characterized by the local PG and local clock driver that are additional to the conventional PD-FF composed of a transfer gate and a latch circuit. Each flip-flop circuit of the first embodiment fetches data prepared at an input node when the pulse signal provided by the local PG is "1", and after an output definition period T3, provides the fetched data from an output node. While the pulse signal is being "0", the flip-flop circuit keeps the input data.

The shift register of the first embodiment is formed by connecting such flip-flop circuits (the flip-flop circuits of the present invention) in series in M stages. The M pieces of the clock drivers are connected to its left neighbor from the last stage toward the first stage, so that the clock signal CLK is successively transmitted from the flip-flop circuit 1-M toward the flip-flop circuit 1-1.

Figure 4B:
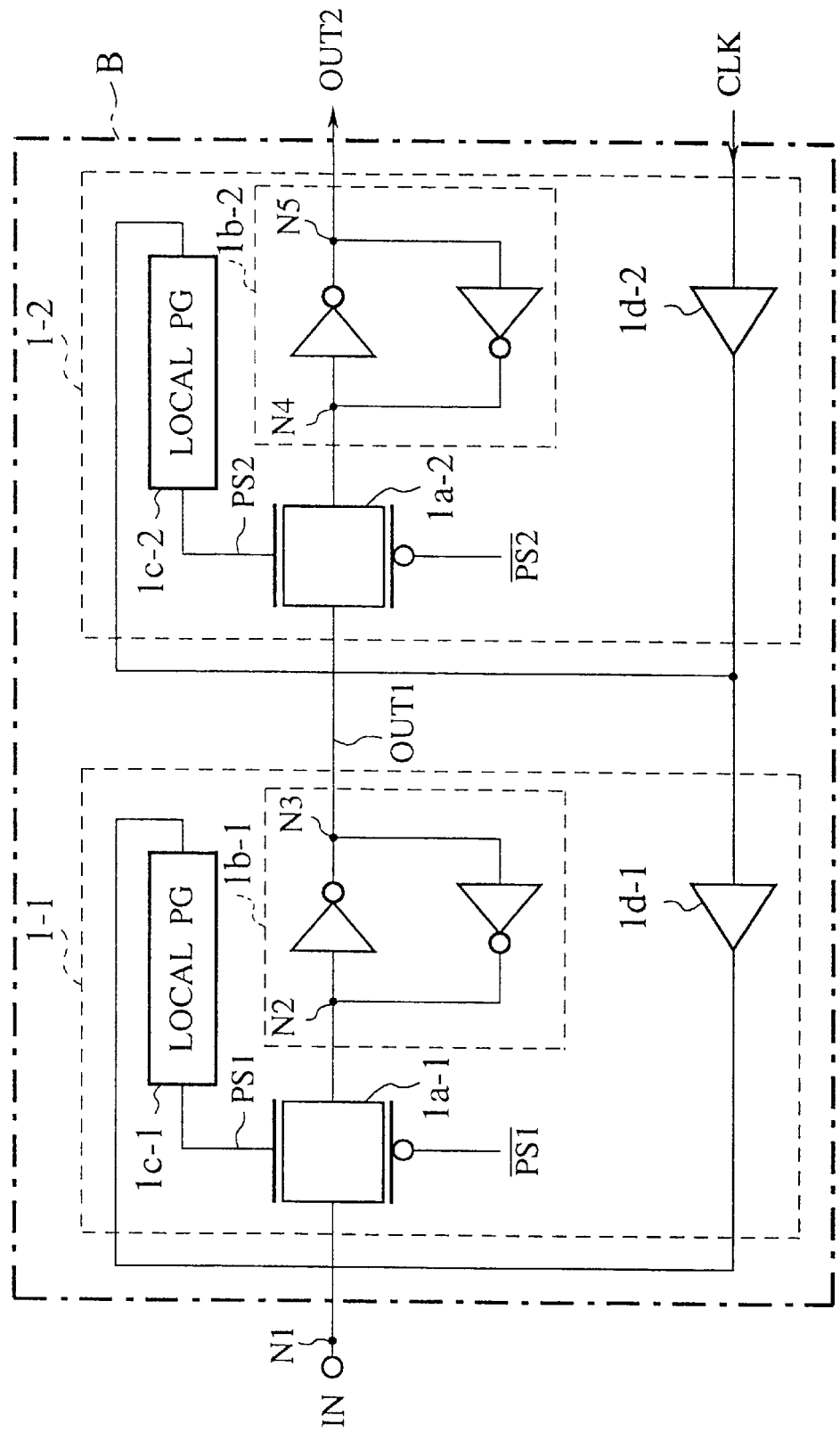
FIG. 4B shows a part B of FIG. 4A.
Figure 4C:
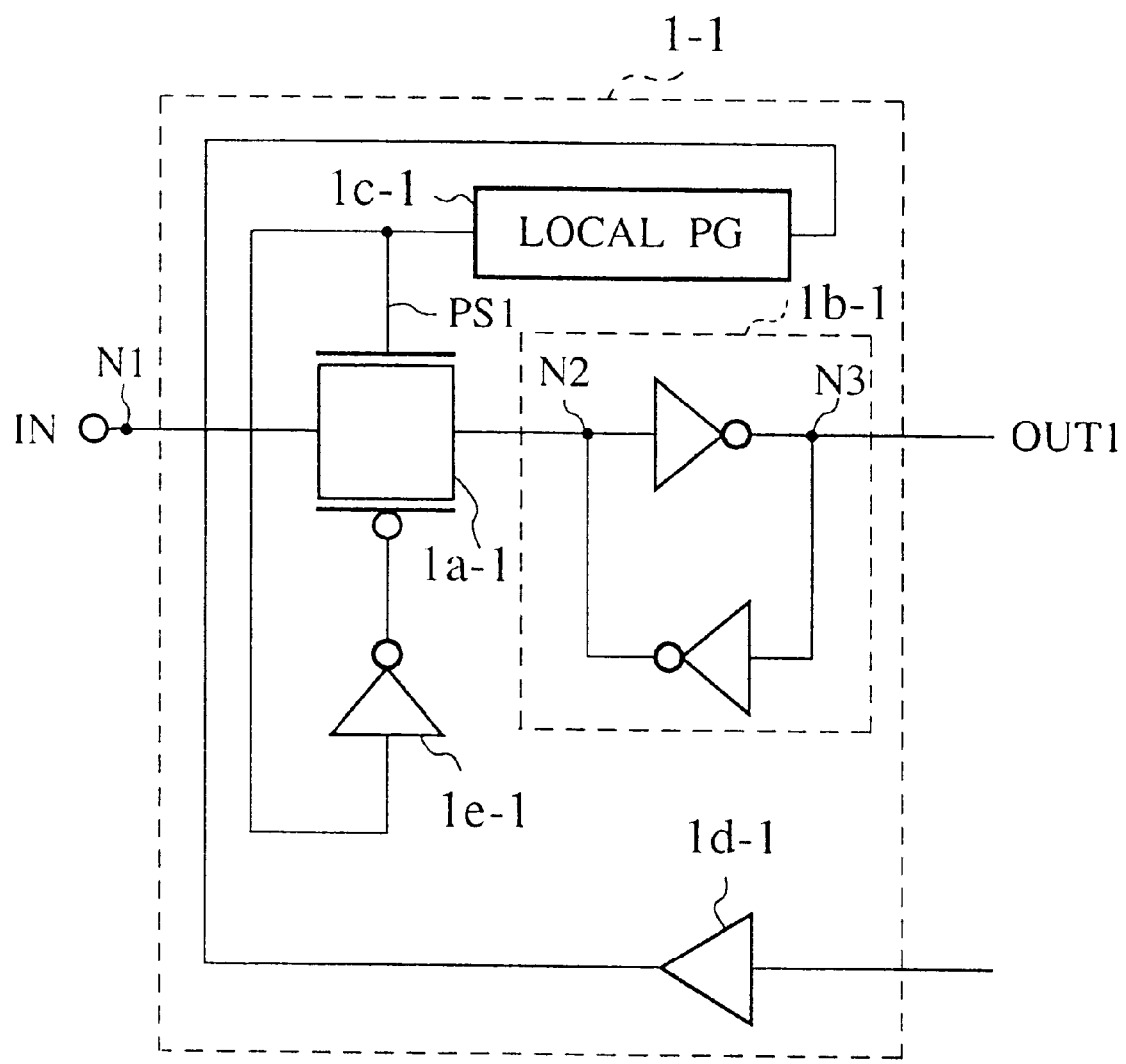
FIG. 4C shows the details of a flip-flop circuit that forms a part of the shift register of FIG. 4A.

FIG. 4B is a circuit diagram showing a part B of FIG. 4A. The part B includes the flip-flop circuits of the present invention 1-1 and 1-2 connected in series. In the flip-flop circuit 1-1, the transfer gate 1a-1 is a CMOS transfer gate having two gate terminals that operates on the pulse signal PS1 applied to one of two gate terminals by the local PG 1c-1 and an inverted pulse signal $\overline{PS1}$ applied to another gate terminal. The output terminal of the transfer gate 1a-1 is connected to the latch circuit 1b-1, which provides output data Out1. The inverted pulse signal $\overline{PS1}$ is provided by an inverter 1e-1 (FIG. 4C) that is connected to the pulse signal generator 1c-1, to invert the pulse signal PS1. Although it is possible to arrange another local pulse generator (PG) for generating the inverted pulse signal $\overline{PS1}$, it will complicate the flip-flop circuit. The flip-flop circuit 1-2 involves a pulse signal PS2 generated by the local PG 1c-2, an inverted pulse signal $\overline{PS2}$, and output data Out2. The inverted pulse signal $\overline{PS2}$ is provided by an inverter that is connected to the pulse signal generator 1c-2, like the example of FIG. 4C. An input node N1 receives input data In. An intermediate node N2 is formed between the transfer gate 1a-1 and the latch circuit 1b-1. The output node N3 serves as the output terminal of the latch circuit 1b-1 and provides the output data Out1 of the flip-flop circuit 1-1.

The flip-flop circuit 1-2 has an intermediate node N4 between the transfer gate 1a-2 and the latch circuit 1b-2 and an output node N5 that serves as an output terminal of the latch circuit 1b-2. The output node N5 provides the output data Out2 of the flip-flop circuit 1-2.

The input data In supplied to the input node N1 is successively transferred through the M stages of the flip-flop circuits 1-1 to 1-M in synchronization with the pulse signals provided by the local PGs 1c-1 to 1c-M and removed (read) from the output node. This serial input-output operation will be explained with the flip-flop circuits 1-1 and 1-2 of FIG. 4B and a timing chart of FIG. 4D.

At time t1, the pulse signal PS2 rises to "1" and the inverted pulse signal $\overline{PS2}$ falls to "0" in the flip-flop circuit 1-2, to turn on the transfer gate 1a-2. Suppose the output data Out1 of the flip-flop circuit 1-1 is "A" at this moment.

The data "$\overline{A}$" is transferred to the intermediate node N4 of the flip-flop circuit 1-2 and the potential of the intermediate node N4 reaches to a threshold potential of the output inverter in the latch circuit 1b-2 after a lapse of T4. At time t2 with a lapse of an output definition period T3 from the time t1, the data "A" is provided as the output data Out2 from the output node N5 of the flip-flop circuit 1-2.

At time t3 after a delay period T2 from the time t1, the pulse signal PS1 rises to "1" and the inverted pulse signal $\overline{PS1}$ falls to "0" in the flip-flop circuit 1-1. Since the first embodiment supplies the clock signal CLK in sequence from the flip-flop circuit 1-M toward the flip-flop circuit 1-1, a pulse signal in a hind flip-flop circuit rises earlier than a pulse signal in a front flip-flop circuit. A delay between the front and hind flip-flop circuits is defined as the delay time T2.

When the pulse signal PS1 rises to "1" and the inverted pulse signal $\overline{PS1}$ falls to "0" in the flip-flop circuit 1-1, the transfer gate 1a-1 turns on. Suppose the input data In at this moment is "A+1". The data "A+1" is transferred to the node N2, and the potential at the node N2 reaches the threshold potential of the inverter in the latch circuit 1b-1 with the period T4. At time t4 after the output definition period T3 from the time t3, the data "A+1" is inverted and the data "A+1" is transferred to the output node N3 as the output data Out1.

At the time t4, the transfer gate 1a-2 of the second flip-flop circuit 1-2 is OFF, and therefore, the data "A+1" never passes through the flip-flop circuit 1-2. After a predetermined time (not shown), when the pulse signal PS2 rises again to "1" and simultaneously the inverted pulse signal $\overline{PS2}$ falls to "0", the transfer gate 1a-2 turns on, and with a lapse of the output definition period T3 after the predetermined time, the data "A+1" will be provided as the output data Out2 from the output node N5 of the flip-flop circuit 1-2. Even if the transfer gate 1a-2 is in a conduction state at time t4, "the data-pass-through problem" is never occurred as far as the transfer gate 1a-2 turns off before the potential of the intermediate node N4 reaches the threshold potential of the output inverter constituting the latch circuit 1b-2 at time t5.

Figure 3A:
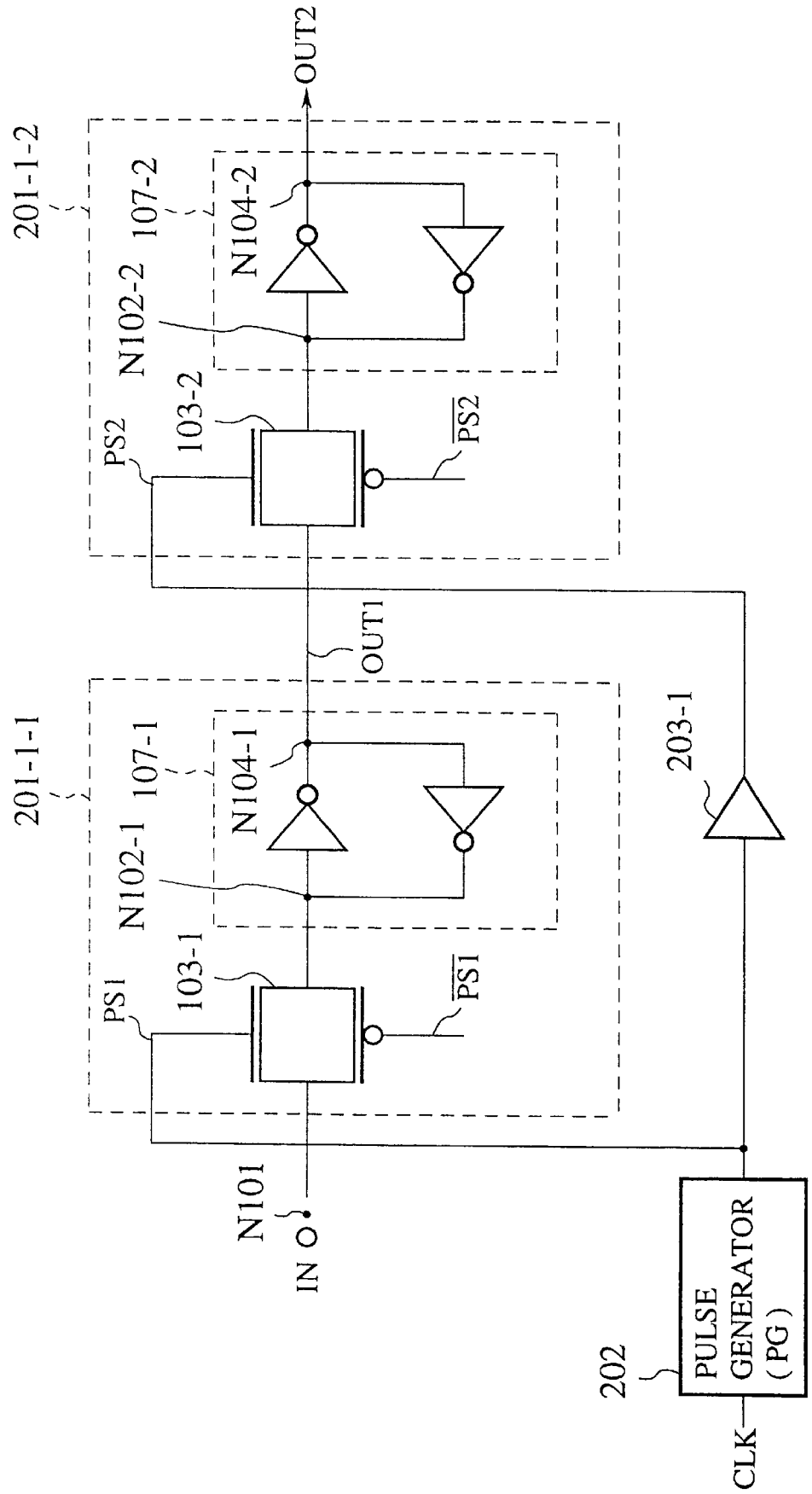
FIG. 3A is a circuit diagram showing a part A of FIG. 2.
Figure 3C:
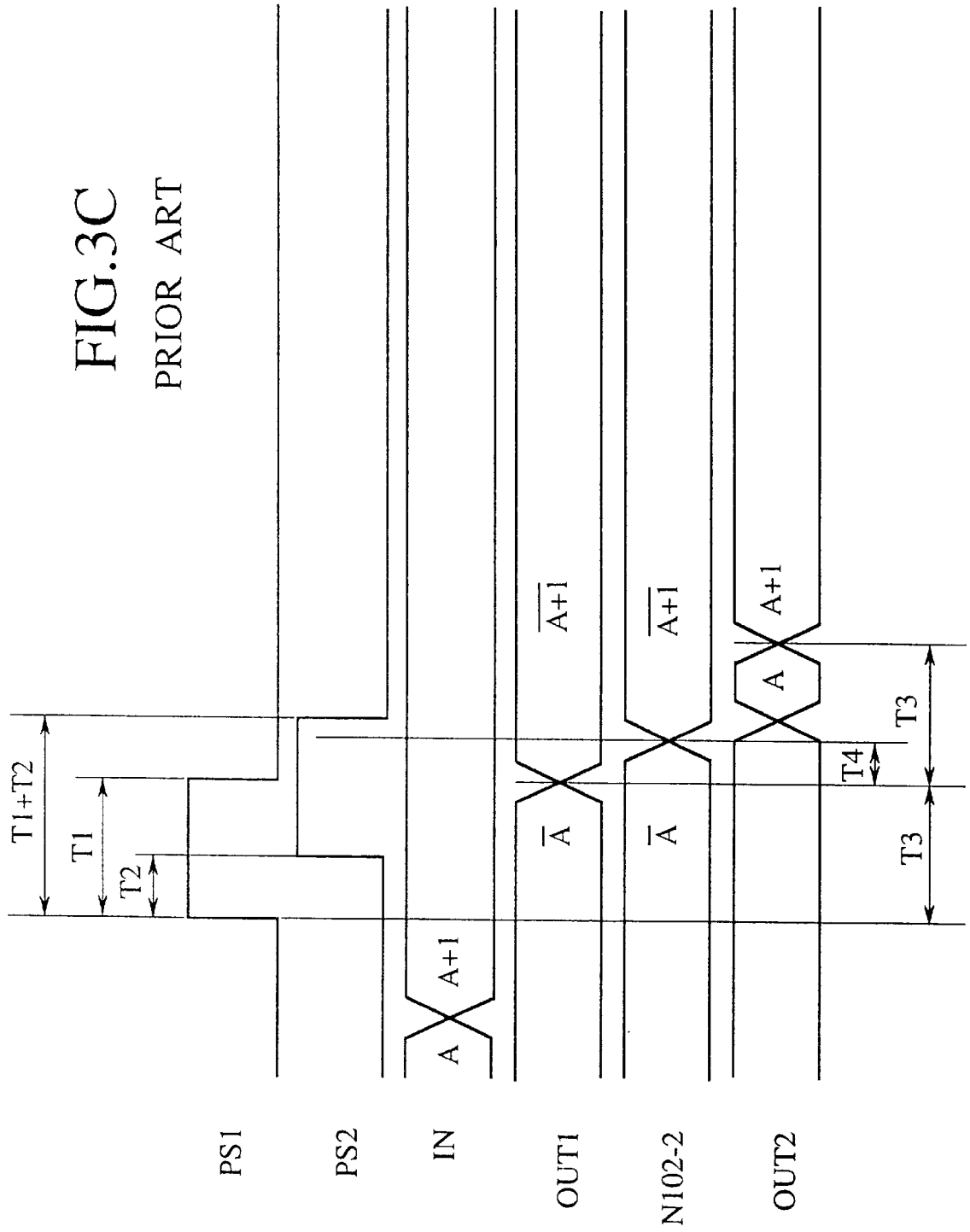
FIG. 3C is a timing chart showing the data-pass-through problem occurring in the part A.

In this way, the clock signal CLK is supplied from the flip-flop circuit 1-2 to the flip-flop circuit 1-1. Consequently, the first embodiment shortens a period Z that starts when the pulse signal PS1 becomes "1" to fetch the data In and ends when the transfer gate of the flip-flop circuit 1-2 is turned off. More precisely, the first embodiment shortens the period Z from "T1+T2" of the prior art (see, FIGS. 3B and 3C) to "T1-T2" so that the period Z is always shorter than the sum of the output definition period T3 and the delay time T4 required for the potential at the intermediate node reaches to the threshold potential. Hence the first embodiment can surely prevent data from being passed from the input node N1 to the output node N5 all at once.

In FIG. 4D, T1 is a pulse width of the pulse signals PS1 and PS2, T2 is a delay time between the pulse signals PS1 and PS2, and T3 is the output definition period that starts when the pulse signal PS1 (PS2) is supplied to the gate terminal of the transfer gate 1a-1 (1a-2) and ends when the output Out1 (Out2) is provided. And T4 is the delay time required for the potential at the intermediate node N2 (N4) to reach the threshold potential of the output inverter in the latch circuit 1b-1 (1b-2) after an input data In (an output data Out1) arrived at the input node N1 (the output node N3) while the transfer gate 1a-1 (1a-2) is in a conduction state.

Second Embodiment

Figure 5:
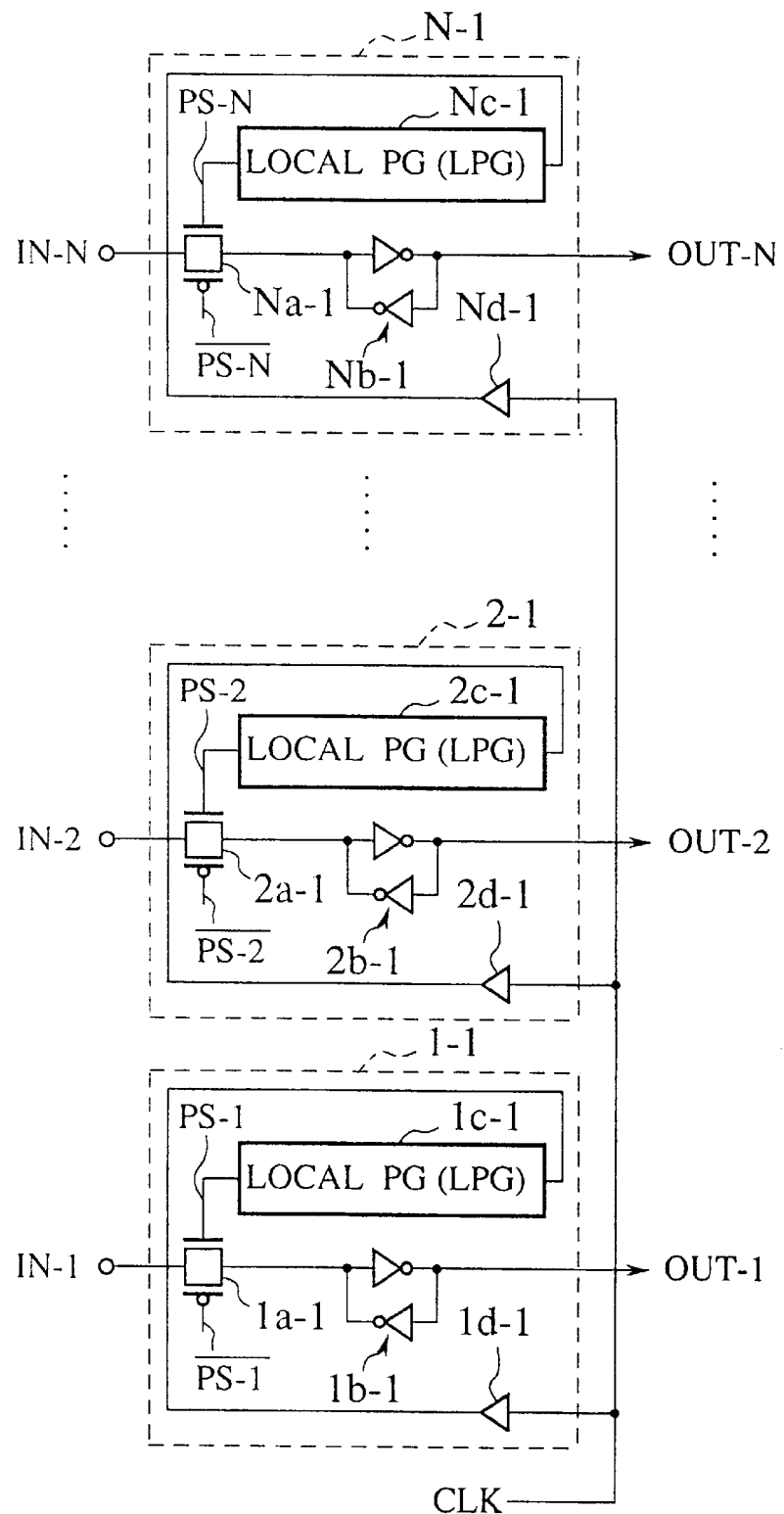
FIG. 5 shows an N-bit register according to a second embodiment of the present invention.

FIG. 5 shows an N-bit register according to the second embodiment of the present invention. The N-bit register consists of N flip-flop circuits each of which is the same flip-flop circuit of the present invention employed in the first embodiment. The N flip-flop circuits are connected in parallel and receive a common clock signal CLK. The flip-flop circuit 1-1 for the first bit is identical to the flip-flop circuit 1-1 of FIG. 4A, and each of the flip-flop circuits 2-1 to N-1 has the same structure as the first flip-flop circuit 1-1. Namely, the flip-flop circuits 1-1 to N-1 have transfer gates 1a-1 to Na-1, latch circuits 1b-1 to Nb-1, local PGs (LPGs) 1c-1 to Nc-1, and clock drivers 1d-1 to Nd-1. Each latch circuit 1b-1, 2b-1 ..., Nb-1 consists of an output inverter and a feedback inverter connected in an antiparallel manner.

Input data In-1 to In-N of N bits are simultaneously supplied to all the input nodes of the flip-flop circuits 1-1 to N-1, and the common clock signal CLK is simultaneously supplied to the clock drivers 1d-1 to Nd-1. The LPGs 1c-1 to Nc-1 generate required pulse signals PS-1 to PS-N in response to the outputs of the clock drivers 1d-1 to Nd-1. The waveforms of these pulse signals PS-1 to PS-N are guaranteed to sharply indicate "1" or "0" because they are generated by independent LPGs 1c-1 to Nc-1.

When the pulse signals PS-1 to PS-N rise to "1", the transfer gates 1a-1 to Na-1 turn on to simultaneously fetch the input data In-1 to In-N. These data reach the respective output nodes after an output definition period T3 and are simultaneously provided as output data Out-1 to Out-N, and the N-bit register of the second embodiment shows the parallel input-output operation. These output data are kept as they are while the pulse signals PS-1 to PS-N are being "0".

In this way, the LPGs 1c-1 to Nc-1 directly supply the local pulse signals PS-1 to PS-N to the transfer gates 1a-1 to Na-1, respectively. As a result, the pulse signals of the second embodiment are each sharp to cause no malfunctions in the N-bit register, unlike the prior art that provides to parallel PD-FFs with a common pulse signal by a single pulse generator under increased gate load. In addition, the second embodiment distributes load of driving a large number of flip-flop circuits, and therefore, is capable of properly suppressing the increase of the driving capability of the clock drivers.

Third Embodiment

Figure 6:
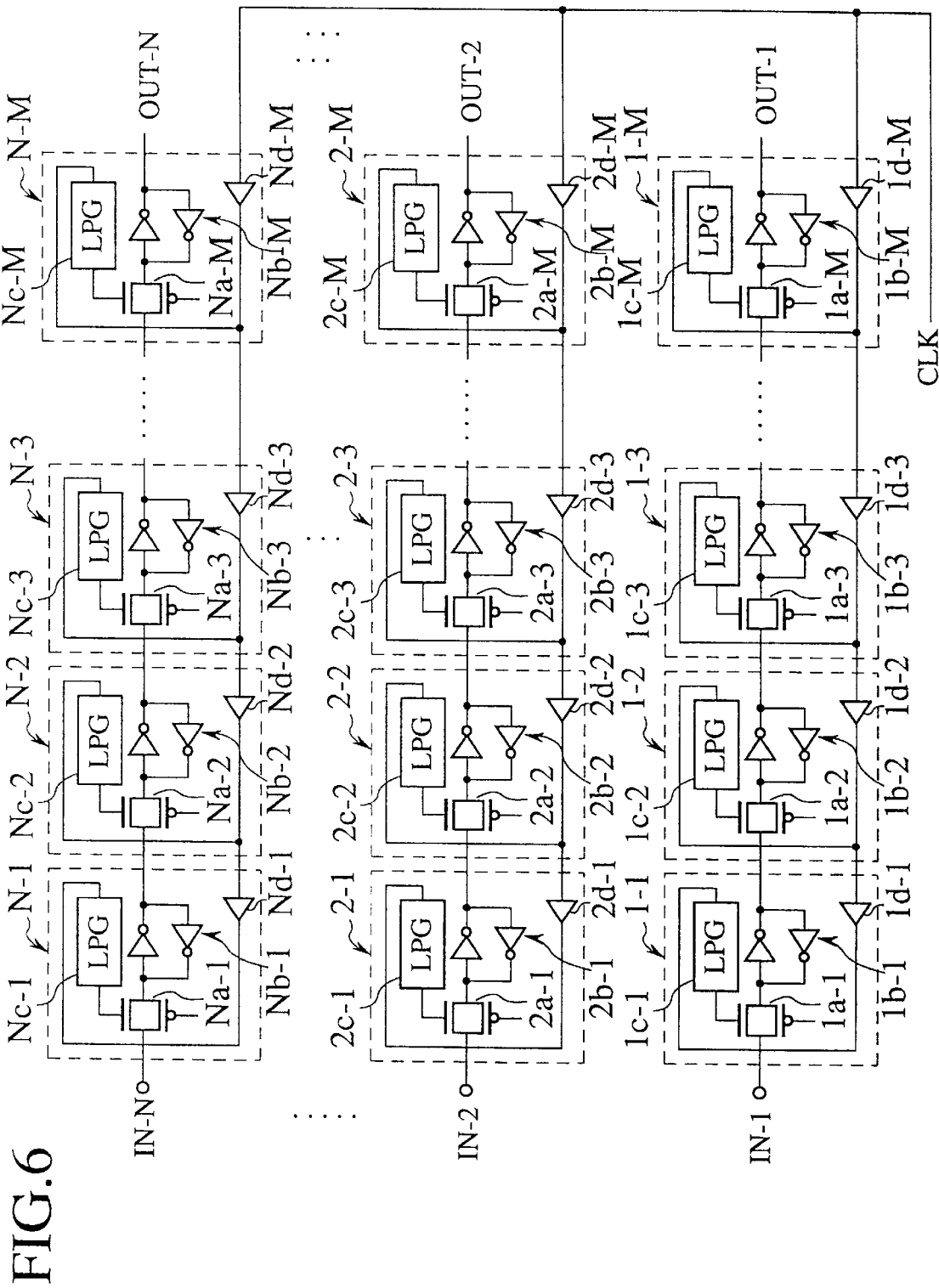
FIG. 6 shows a logic circuit according to a third embodiment of the present invention.

FIG. 6 shows a logic circuit according to the third embodiment of the present invention. This logic circuit is an N-bit shift register made of M stages of N-bit registers each being the same as that of the second embodiment of FIG. 5. Namely, the third embodiment is a combination of the first and second embodiments. In transfer lines of the shift registers for first to Nth bits, clock drivers 1d-M to 1d-1, to Nd-M to Nd-1 are connected in series from the last stage toward the first stage. The last clock drivers 1d-M to Nd-M receive simultaneously a common clock signal CLK, so that the clock signal CLK is successively transmitted from the last flip-flop circuit to the first flip-flop circuit in each transfer line.

The N-bit register in the first stage disposed in a left side is the same as the N-bit register of FIG. 5 and consists of flip-flop circuits 1-1 to N-1. These flip-flop circuits 1-1 to N-1 consist of transfer gates 1a-1 to Na-1, latch circuits 1b-1 to Nb-1, LPGs 1c-1 to Nc-1, and clock drivers 1d-1 to Nd-1. Each latch circuit 1b-1, 1b-2, ..., 1b-M consists of an output inverter and a feedback inverter connected in antiparallel manner. The N-bit register in any one of the second to last stages has the same structure as the N-bit register in the first stage. More precisely, the second N-bit register consists of flip-flop circuits 1-2 to N-2, which include transfer gates 1a-2 to Na-2, latch circuits 1b-2 to Nb-2, LPGs 1c-2 to Nc-2, and clock drivers 1d-2 to Nd-2. The third N-bit register consists of flip-flop circuits 1-3 to N-3, which have transfer gates 1a-3 to Na-3, latch circuits 1b-3 to Nb-3, LPGs 1c-3 to Nc-3, and clock drivers 1d-3 to Nd-3.

The Mth (last) N-bit register consists of flip-flop circuits 1-M to N-M, which have transfer gates 1a-M to Na-M, latch circuits 1b-M to Nb-M, LPGs 1c-M to Nc-M, and clock drivers 1d-M to Nd-M.

Input data In-1 to In-N of N bits in total are simultaneously supplied to all the input nodes of the flip-flop circuits 1-1 to N-1. On the other hand, the clock drivers 1d-M to Nd-M in the last stage commonly receive the clock signal CLK. Similar to the first embodiment, the input data In-1 to In-N entered at a time at each input node are successively transferred through the N lines of the M flip-flop circuits and are simultaneously removed (read) as output data Out-1 to Out-N, thus the third embodiment permits parallel data transfers.

This logic circuit is capable of surely preventing the data-pass-through problem and insures the sharp waveform of pulse signals. In addition, the logic circuit can properly suppress the demand for the larger driving capability of each clock driver, to thereby reduce the size thereof.

Fourth Embodiment

Figure 7:
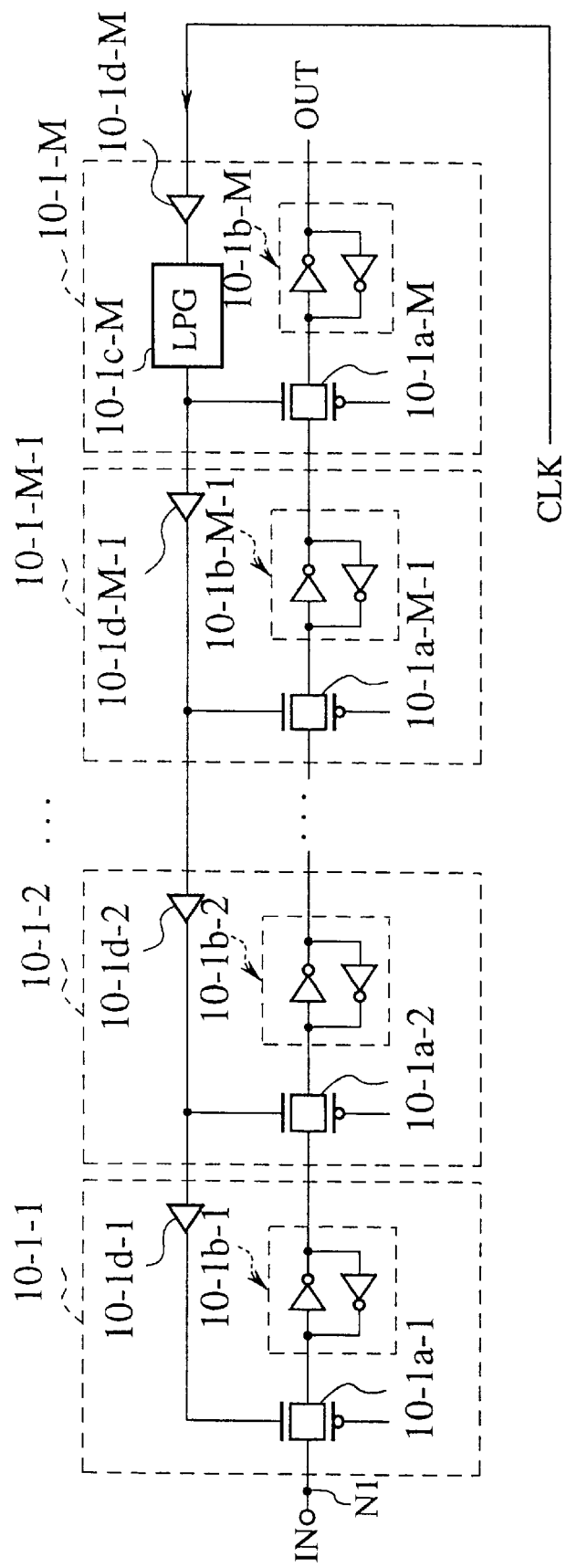
FIG. 7 shows a shift register according to a fourth embodiment of the present invention.

FIG. 7 shows a shift register according to the fourth embodiment of the present invention. Unlike the shift register of the first embodiment that provides every flip-flop circuit with a local pulse generator (PLG) to which a clock signal is successively given from the last stage, the fourth embodiment employs the flip-flop circuit of any one of the first to third embodiments only in the last stage. The flip-flop circuit of any one of the first to third embodiments is hereinafter referred to as "the first-type flip-flop circuit". More precisely, the fourth embodiment employs second-type flip-flop circuits that are different from the first-type flip-flop circuit, each second flip-flop circuit connected to its left or right neighbor, and only in the last stage, arranges the first-type flip-flop circuit having an LPG 10-1c-M. The output of the LPG 10-1c-M is transmitted to a second-type flip-flop 10-1-M-1 disposed in left neighbor of it, and further is sequentially transmitted to the other second-type flip-flop circuits. The shift register of the fourth embodiment consists of series-connected "M−1" pieces of the second-type flip-flop circuits in first to "M−1"th stages, each of which is a conventional PD-FF plus a pulse driver, and the first-type flip-flop circuit at the Mth (last) stage connected to the second-type flip-flop circuit at the "M−1"th stage.

In FIG. 7, the second-type flip-flop circuits 10-1-1 to 10-1-(M−1) in the first to "M−1"th stages have the same structure. For example, the flip-flop circuit 10-1-1 consists of a transfer gate (a CMOS transfer gate) 10-1a-1 and a latch circuit 10-1b-1 that form a conventional PD-FF, and in addition, a pulse driver 10-1d-1 that supplies a pulse signal transmitted from a hind stage to one of two gate terminals of the transfer gate 10-1a-1. At this time, another gate terminal of the transfer gate 10-1a-1 also receives an inverted pulse signal, which may be produced in the same manner as in FIG. 4C. In more detail, the pulse driver 10-1d-1 receives a pulse signal transmitted from the LPG 10-1c-M, and the output of the LPG 10-1d-1 is connected to an inverter that provides the inverted pulse signal. The flip-flop circuits 10-1-2 to 10-1-(M−1) have each the same structure as the flip-flop circuit 10-1-1. Namely, they have CMOS transfer gates 10-1a-2 to 10-1a-(M−1), latch circuits 10-1b-2 to 10-1b-(M−1), and pulse drivers 10-id-2 to 10-1d-(M−1). The pulse drivers 10-1d-(M−1) to 10-1d-1 are connected in series from the "M−1"th stage toward the first stage.

The first-type flip-flop circuit 10-1-M in the Mth stage has the same structure as that of FIGS. 4A, 4B, 4D, etc. Namely, it has a CMOS transfer gate 10-1a-M and a latch circuit 10-1b-M that form a conventional PD-FF, the local pulse generator (LPG) 10-1c-M, and a clock driver 101d-M. The LPG 10-1c-M generates a pulse signal according to a clock signal CLK provided by the clock driver 10-1d-M and supplies the pulse signal sequentially to the pulse drivers 10-1d-(M−1) to 10-1d-1. An inverter may be connected to the output of the LPG 10-1c-M, and other pulse drivers may sequentially be connected to the output of the inverter in the "M−1"th to first stages, so that the other gates of CMOS transfer gates in the "M−1"th to first stages successively receive the inverted pulse signal. Although it is possible to arrange another local pulse generator to generate the inverted pulse signal in the flip-flop circuit 10-1-M in the Mth stage, it will complicate the structure.

In this way, the first-type flip-flop circuit 10-1-M in the last stage incorporates the LPG 10-1c-M that generates a pulse signal. The pulse signal is successively transmitted to the flip-flop circuits 10-1-(M−1) to 10-1-1 in this order. In synchronization with the pulse signal, input data In at an input node N1 is successively transferred from the flip-flop circuit 10-1-1 toward the flip-flop circuit 10-1-M. The operation of this is the same as that of the first embodiment explained with reference to FIG. 4D.

Similar to the first embodiment, the fourth embodiment surely prevents the data-pass-through problem. Since the fourth embodiment arranges the LPG only in the last stage, it reduces a circuit scale. Although it is dependent on the structure of the LPG, the fourth embodiment is capable of halving the area of the shift register of the first embodiment.

Fifth Embodiment

Figure 8:
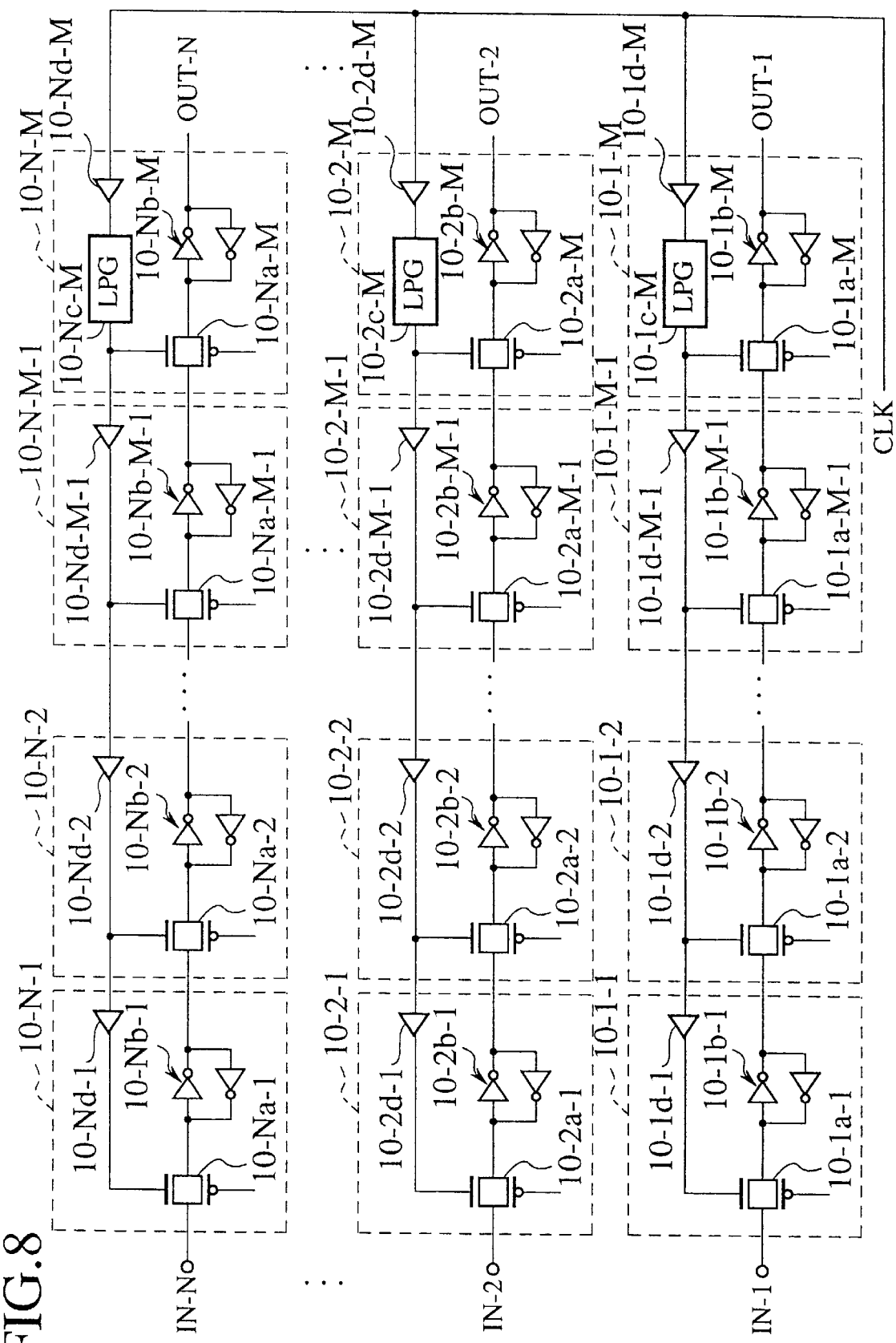
FIG. 8 shows a logic circuit according to a fifth embodiment of the present invention.

FIG. 8 shows a logic circuit according to the fifth embodiment. This logic circuit is an N-bit shift register consisting of N shift registers each being the same as the shift register mentioned in the fourth embodiment of FIG. 7. Namely, each transfer line of any one of the first to Nth bits that are in parallel with one other is made of the shift register of FIG. 7.

The first transfer line of the fifth embodiment is identical to the shift register of FIG. 7, and the second line and others are also the same. For example, the second line for the second bit is made of first to Mth stages, and among them, the first to "M−1"th stages consist of second-type flip-flop circuits 10-2-1 to 10-2-(M−1) that incorporate transfer gates 10-2a-1 to 10-2a-(M−1), latch circuits 10-2b-1 to 10-2b-(M−1), and pulse drivers 10-2d-1 to 10-2d-(M−1). The Nth line for the Nth bit is made of first to Mth stages, and among them, the first to "M−1"th stages consist of second-type flip-flop circuits 10-N-1 to 10-N-(M−1) that incorporate transfer gates 10-Na-1 to 10-Na-(M−1), latch circuits 10-Nb-1 to 10-Nb-(M−1), and pulse drivers 10-Nd-1 to 10-Nd-(M−1). The last stages of all transfer lines for all bits are made of first-type flip-flop circuits 10-1-M to 10-N-M that incorporate transfer gates 10-1a-M to 10-Na-M, latch circuits 10-1b-M to 10-Nb-M, local pulse generators (LPGs) 10-1c-M to 10-Nc-M, and clock drivers 10-1d-M to 10-Nd-M.

The last clock drivers 10-1d-M to 10-Nd-M receive a common clock signal CLK, and based on the outputs of these clock drivers, the LPGs 10-1c-M to 10-Nc-M supply pulse signals to the second-type flip-flop circuits.

Input data In-1 to In-N of N bits in total are simultaneously supplied to all input nodes of the second-type flip-flop circuits 10-1-1 to 10-N-1, respectively. On the other hand, the common clock signal CLK is supplied to the last clock drivers 10-1d-M to 10-Nd-M. Accordingly, the input data In-1 to In-N entered at a time are sequentially transferred through the M stages of the flip-flop circuits and are simultaneously removed (read) as output data Out-1 to Out-N, and the fifth embodiment permits parallel data transfers.

The fifth embodiment is capable of surely preventing the data-pass-through problem and maintaining sharp waveform of the pulse signals during operation. In addition, the fifth embodiment is capable of employing small clock drivers, to greatly reduce a circuit scale.

Various modifications will become possible for those skilled in the art after receiving the teachings of the present disclosure without departing from the scope thereof.

What is claimed is:

1. A sequence of flip-flop circuits comprising:
   (a) first flip-flop circuit comprising:
      a first transfer gate for passing and blocking input data in response to a first exclusive pulse signal having a predetermined pulse width;
      a first latch circuit connected to an output end of the first transfer gate; and
      a first local pulse generator disposed individually in the first flip-flop circuit for generating the first exclusive pulse signal based on a clock signal, the first exclusive pulse signal being used only in the first flip-flop circuit; and
   (b) a second flip-flop circuit disposed next to and connected to the first flip-flop circuit, the second flip-flop circuit comprising:
      a second transfer gate for passing and blocking the input data transferred from the first flip-flop circuit in response to a second exclusive pulse signal rising earlier than the first exclusive pulse signal, the second exclusive pulse signal having the predetermined pulse width;
      a second latch circuit connected to an output end of the second transfer gate; and
      a second local pulse generator disposed individually in the second flip-flop circuit for generating the second exclusive pulse signal based on the clock signal, the second exclusive pulse signal being used only in the second flip-flop circuit.

2. The sequence of flip-flop circuits of claim 1, further comprising:
   a first clock driver connected to an input end of the first local pulse generator, for supplying the clock signal to the first local pulse signal generator; and
   a second clock driver connected to an input end of the second local pulse generator, for supplying the clock signal to the second local pulse signal generator and to the first clock driver.

3. The sequence of flip-flop circuits of claim 1, wherein the first and second transfer gates are first and second CMOS transfer gates having two gate terminals, respectively.

4. The sequence of flip-flop circuits of claim 3, further comprising:
   a first inverter arranged between and connected to an output end of the first local pulse generator and one of two gate terminals of the first CMOS transfer gate; and
   a second inverter arranged between and connected to an output end of the second local pulse generator and one of two gate terminals of the second CMOS transfer gate.

5. The sequence of flip-flop circuits of claim 2, wherein the first and second transfer gates are first and second CMOS transfer gates having two gate terminals, respectively.

6. The flip-flop circuit of claim 5, further comprising:
   a first inverter arranged between and connected to an output end of the first local pulse generator and one of two gate terminals of the first CMOS transfer gate; and
   a second inverter arranged between and connected to an output end of the second local pulse generator and one of two gate terminals of the second CMOS transfer gate.

7. A shift register including M flip-flop circuits connected in series so as to form a sequence from first through Mth stage flip-flop circuits, M being an integer greater than two, the second stage flip-flop circuit disposed next to the first stage flip-flop circuit, the first stage flip-flop circuit comprising:
   (a) a transfer gate for passing and blocking input data in response to an exclusive pulse signal for the first stage flip-flop circuit, the exclusive pulse signal rising later than a corresponding exclusive pulse signal for the second stage flip-flop circuit;
   (b) a latch circuit connected to an output end of the transfer gate;
   (c) a clock driver for receiving and driving a clock signal for the first stage flip-flop circuit; and
   (d) a local pulse generator disposed individually in the first stage flip-flop circuit for generating the exclusive pulse signal according to an output of the clock driver, all of the clock driver disposed in the first stage flip-flop circuit and corresponding clock drivers disposed respectively from the second through the Mth stage flip-flop circuits being connected in series so that the clock signal for the second stage flip-flop circuit is transferred from the second to the first stage flip-flop circuit, adding a delay time to the clock signal for the second stage flip-flop circuit so as to form the clock signal for the first stage flip-flop circuit,
   wherein the clock signal is successively transferred from the corresponding clock driver in the Mth stage flip-flop circuit toward the clock driver in the first stage flip-flop circuit.

8. The shift register of claim 7, wherein the transfer gate is a CMOS transfer gate having two gate terminals.

9. The shift register of claim 8, further comprising:
   an inverter arranged between and connected to an output end of the local pulse signal generator and one of two gate terminals of the CMOS transfer gate.

10. A sequence of N-bit registers comprising first and second N-bit registers connected in series, each of the first and second N-bit registers having an ordered set of N flip-flop circuits connected in parallel so as to form a parallel input-output, where N denotes a positive integer, each of the N flip-flop circuits in the first N-bit register comprising:
    (a) a transfer gate for passing and blocking input data in response to an exclusive pulse signal for each of the N flip-flop circuits in the first N-bit register, the exclusive pulse signal rising later than a corresponding exclusive pulse signal used for a corresponding flip-flop circuit in the second N-bit register;
    (b) a latch circuit connected to an output end of the transfer gate;
    (c) a clock driver for receiving a clock signal supplied from the second N-bit register and driving the clock signal, the clock signal being delayed by a delay time of the second N-bit register from a corresponding clock signal supplied to the second N-bit register; and (d) a local pulse generator disposed individually in each of the N flip-flop circuits in the first N-bit register, for generating the exclusive pulse signal according to an output of the clock driver.

11. The N-bit register of claim 10, wherein the transfer gate is a CMOS transfer gate having two gate terminals.

12. The N-bit register of claim 11, further comprising:

an inverter arranged between and connected to an output end of the local pulse signal generator and one of two gate terminals of the CMOS transfer gate.

13. A logic circuit having an ordered set of N shift registers connected in parallel so as to form a parallel input-output, where N denotes a positive integer, each of the N shift registers comprising a sequence of M flip-flop circuits connected in series, so as to be arranged from first through Mth stages, M being an integer greater than two, each of the M flip-flop circuits comprising:

(a) a transfer gate for passing and blocking input data in response to an exclusive pulse signal for each of the M flip-flop circuits;

(b) a latch circuit connected to an output end of the transfer gate;

(c) a clock driver for receiving and driving a clock signal for each of the M flip-flop circuits; and (d) a local pulse generator disposed individually in each of the M flip-flop circuits, for generating the exclusive pulse signal according to the output of the clock driver, wherein the clock drivers in each of the M flip-flop circuits are connected in series so that the clock signal is transferred successively from neighboring stage except for between "M−1"th and Mth stages, adding a delay time to the clock signal used for neighboring stage so as to form the clock signal for each of the M flip-flop circuits, and all the clock drivers of the N shift registers at the Mth stage simultaneously receive a common clock signal so that the common clock signal is transferred from the Mth stage to the "M−1"th stage adding the delay time to the common clock signal so as to form the clock signal for the "M−1"th stage.

14. The logic circuit of claim 13, wherein the transfer gate is a CMOS transfer gate having two gate terminals.

15. The logic circuit of claim 14, further comprising:

an inverter arranged between and connected to an output end of the local pulse signal generator and one of two gate terminals of the CMOS transfer gate.

16. A shift register having a sequence of M flip-flop circuits connected in series so as to be arranged from first through Mth stages, where M is a positive integer greater than two, each of the flip-flop circuits comprising:

(a) a transfer gate for passing and blocking input data in response to a pulse signal;

(b) a latch circuit connected to an output end of the transfer gate; and (c) a pulse driver for receiving and driving the pulse signal, wherein only the flip-flop circuit in the Mth stage further comprises a local pulse generator connected between the transfer gate and the pulse driver in the Mth stage, for generating the pulse signal based on a clock signal supplied to the Mth stage, the local pulse generator further connected to the pulse driver in "M−1"th stage, and wherein the pulse drivers from the first to the "M−1"th stage are connected in series so that the pulse signal generated by the local pulse generator is successively transferred through the pulse driver in the "M−1"th stage toward the pulse driver in the first stage.

17. The shift register of claim 16, wherein the transfer gate is a CMOS transfer gate having two gate terminals.

18. The shift register of claim 17, further comprising:

an inverter connected to an output end of the local pulse generator to provide an inverted pulse signal to one of two gate terminals of the CMOS transfer gate.

19. The shift register of claim 17, further comprising:

an inverter arranged between and connected to an output end of the pulse driver and one of two gate terminals of the CMOS transfer gate.

20. A logic circuit having an ordered set of N shift registers connected in parallel so as to form a parallel input-output, where N denotes a positive integer, each of the N shift registers including a sequence of M flip-flop circuits connected in series, so as to be arranged from first through Mth stages, where M is a positive integer greater than two, each of the M flip-flop circuits comprising:

(a) a transfer gate for passing and blocking input data in response to a pulse signal having a predetermined pulse width;

(b) a latch circuit connected to an output end of the transfer gate; and (c) a pulse driver for receiving and driving the pulse signal, wherein only the flip-flop circuit in the Mth stage further comprises a local pulse generator connected between the transfer gate and the pulse driver in Mth stage, for generating the pulse signal based on a common clock signal supplied to the Mth stage, the local pulse generator further connected to the pulse driver in "M−1"th stage, wherein the pulse drivers from the first to the "M−1"th stages are connected in series so that the pulse signal generated by the local pulse generator is successively transferred through the pulse driver in the "M−1"th stage toward the pulse driver in the first stage, and all the clock drivers in the Mth stage simultaneously receive the common clock signal.

* * * * *